United States Patent
Delshadpour et al.

(10) Patent No.: US 11,038,345 B2
(45) Date of Patent: Jun. 15, 2021

(54) OVER-VOLTAGE TOLERANT ANALOG TEST BUS

(71) Applicant: NXP B.V., Eindhoven (NL)

(72) Inventors: Siamak Delshadpour, Phoenix, AZ (US); Xiaoqun Liu, Chandler, AZ (US)

(73) Assignee: NXP B.V., Eindhoven (NL)

(*) Notice: Subject to any disclaimer, the term of this patent is extended or adjusted under 35 U.S.C. 154(b) by 204 days.

(21) Appl. No.: 16/363,991

(22) Filed: Mar. 25, 2019

(65) Prior Publication Data
US 2020/0313428 A1    Oct. 1, 2020

(51) Int. Cl.
G01R 31/28    (2006.01)
H02H 9/04    (2006.01)
H03K 17/0812    (2006.01)

(52) U.S. Cl.
CPC ......... *H02H 9/046* (2013.01); *G01R 31/2884* (2013.01); *H02H 9/041* (2013.01); *H03K 17/08122* (2013.01); *G01R 31/28* (2013.01); *H02H 9/04* (2013.01); *H03K 17/0812* (2013.01)

(58) Field of Classification Search
USPC .................................................. 361/56, 91.1
See application file for complete search history.

(56) References Cited

U.S. PATENT DOCUMENTS

| | | | |
|---|---|---|---|
| 5,319,259 A * | 6/1994 | Merrill | H03K 19/00315 326/21 |
| 6,049,445 A * | 4/2000 | Gauthier, Jr. | H01L 27/0266 327/328 |
| 6,202,183 B1 | 3/2001 | Ginetti et al. | |
| 6,414,533 B1 | 7/2002 | Graves | |
| 2006/0176070 A1* | 8/2006 | Miyano | G11C 29/1201 324/754.03 |
| 2016/0091940 A1 | 3/2016 | Oh et al. | |
| 2017/0059897 A1* | 3/2017 | Xu | G09G 3/006 |

* cited by examiner

*Primary Examiner* — Danny Nguyen
(74) *Attorney, Agent, or Firm* — Rajeev Madnawat

(57) ABSTRACT

An over-voltage tolerant test bus for an integrated circuit (IC) is disclosed. The over-voltage tolerant test bus includes a first switch to be coupled to a test pin of the IC and a second switch to be coupled to an internal module of the IC. The second switch is coupled to the first switch in series. The over-voltage tolerant test bus also includes a protection circuit coupled between the first switch and the second switch and a supply voltage to keep a voltage between a source and a drain of the first switch substantially equal to a difference between a voltage at the test pin and the supply voltage.

15 Claims, 2 Drawing Sheets

OVER-VOLTAGE TOLERANT ANALOG TEST BUS

BACKGROUND

Semiconductor chips and devices may include a test pin to allow interaction of a test probe or a testing system with internal sub-systems during a test mode. Inside the device, a test bus with a switch is connected to the pin. When the switch is ON, the pin is connected with the internal sub-systems for the testing purposes. The switch is turned off during normal use of the device.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In one embodiment, an over-voltage tolerant test bus for an integrated circuit (IC) is disclosed. The over-voltage tolerant test bus includes a first switch to be coupled to a test pin of the IC and a second switch to be coupled to an internal module of the IC. The second switch is coupled to the first switch in series. The over-voltage tolerant test bus also includes a protection circuit coupled between the first switch and the second switch and a supply voltage to keep a voltage between a source and a drain of the first switch substantially equal to a difference between a voltage at the test pin and the supply voltage.

In some examples, the protection circuit includes a protection switch having a first terminal, a second terminal and a gate, the first terminal is coupled to the supply voltage, the second terminal is coupled to a resistor and the gate is driven by a test mode enable signal. The protection switch is configured to be on when the test mode enable signal is inactive. When the test mode enable signal is not active, the protection circuit is configured to provide a voltage equivalent to the supply voltage at the coupling of the first switch and the second switch The first switch and the second switch are configured to be on when a test mode enable signal is active thus providing a conducting path between the test pin and the internal module.

In some embodiments, the over-voltage tolerant test bus may include an electrostatic discharge circuit coupled between the first switch and the test pin.

Each of the first and second switches includes a PMOS and an NMOS transistors coupled together in parallel. In the first switch, the gate of the NMOS transistor and the gate of the PMOS transistor may be coupled to a low leakage control circuit. The low leakage control circuit is configured to reverse bias the body diode of the PMOS transistor. The low leakage control circuit is configured to provide a higher of a supply voltage of the IC and a voltage at the test pin as a reverse biasing voltage and a gate control voltage for the first switch during a normal mode of operation of the IC In the second switch, the gate of the NMOS transistor is configured to be driven by a test mode enable signal and the gate of the PMOS transistor is configured to be driven by an inverse of the test mode enable signal.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments. Advantages of the subject matter claimed will become apparent to those skilled in the art upon reading this description in conjunction with the accompanying drawings, in which like reference numerals have been used to designate like elements, and in which:

Figure 1:
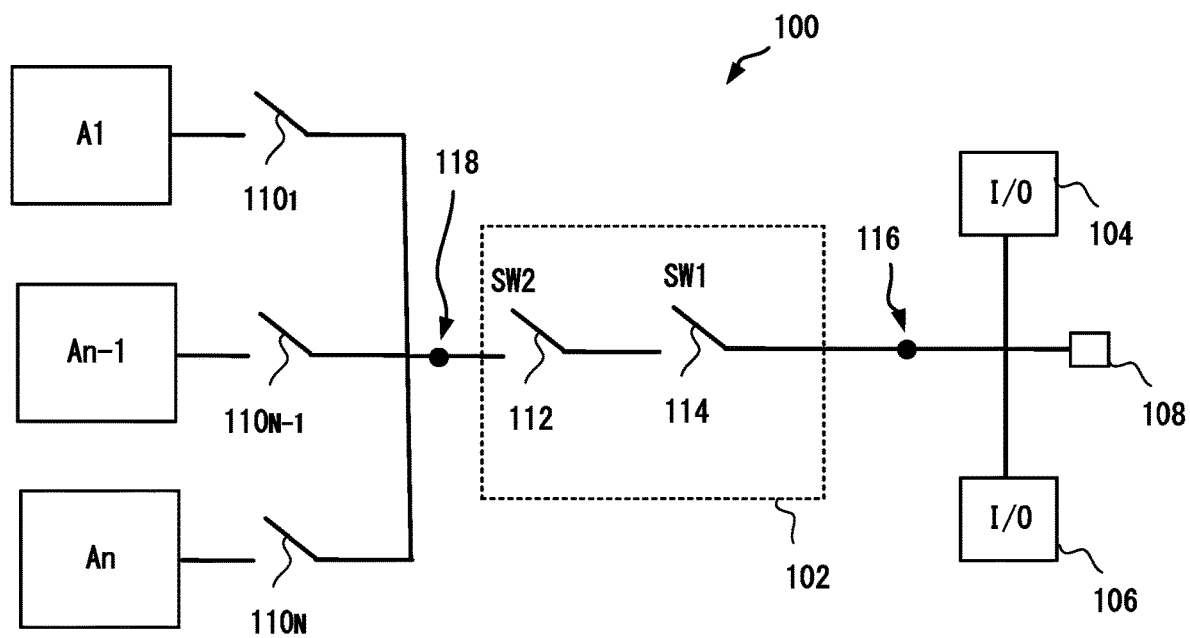
FIG. 1 depicts a device with a test pin and an over-voltage tolerant test bus in accordance with one or more embodiments of the present disclosure.

Note that figures are not drawn to scale. Intermediate steps between figure transitions have been omitted so as not to obfuscate the disclosure. Those intermediate steps are known to a person skilled in the art.

DETAILED DESCRIPTION

Many well-known manufacturing steps, components, and connectors have been omitted or not described in details in the description so as not to obfuscate the present disclosure.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", "one example", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

FIG. 1 shows a device 100 with a test pin 108 and an over-voltage tolerant test bus 102. The device 100 also includes one more or more internal modules such as an internal module $A_1$ coupled to the over-voltage tolerant test bus 102 through a switch $110_1$, an internal module $A_{n-1}$ coupled to the over-voltage tolerant test bus 102 through a switch $110_{n-1}$ and an internal module $A_n$ coupled to the over-voltage tolerant test bus 102 through a switch $110_n$. During a test mode, these switches selectively connects the internal modules with the over-voltage tolerant test bus 102. For example, if the internal module $A_1$ needs to be tested or debugged, the switch $110_1$ is closed to couple the internal module $A_1$ with the over-voltage tolerant test bus 102.

The over-voltage tolerant test bus 102 includes at least two switches SW1 114 and SW2 112 coupled in series. In some embodiments, the device 100 may include I/O ports 104, 106. In some examples, the I/O port 104 may be a General Purpose Input/Output (GPIO) type port and the I/O port 106 may be an inter-integrated circuit (I2C) type port. GPIO is a type of pin that has a dedicated purpose, such as sending a signal to outside of the chip or receiving signal from outside of the chip. The function of a GPIO pin is customizable and can be controlled by software. I2C is a synchronous, multi-master, multi-slave, packet switched, single-ended, serial computer bus. I2C is used for attaching lower-speed peripheral integrated circuits (ICs) to processors and microcontrollers in short-distance, intra-board communication.

In some examples, the internal modules and switches shows in FIG. 1 are typically build using MOS technology and may withstand up to 2.5V. Further, the switches SW1 114 and SW2 112 are CMOS devices to keep the area on the silicon small and cannot withstand higher voltages used by test probes that interact with the test pin 108. In some examples, the test pin 108 may come in touch with a test probe operating at 3.6V. In some other examples, the test pin 108 may come in touch with a test probe using a much higher voltage, for example 7.5V. A typical analog test bus includes one test mode switch instead of SW1 114 and SW2 112 and that single switch may get damaged when a high voltage test probe interacts with the test pin 108. The over-voltage tolerant test bus 102 includes a port 118 to couple to the internal test modules A1, An-1, An, and a port 116 to couple to the test pin 108.

Figure 2:
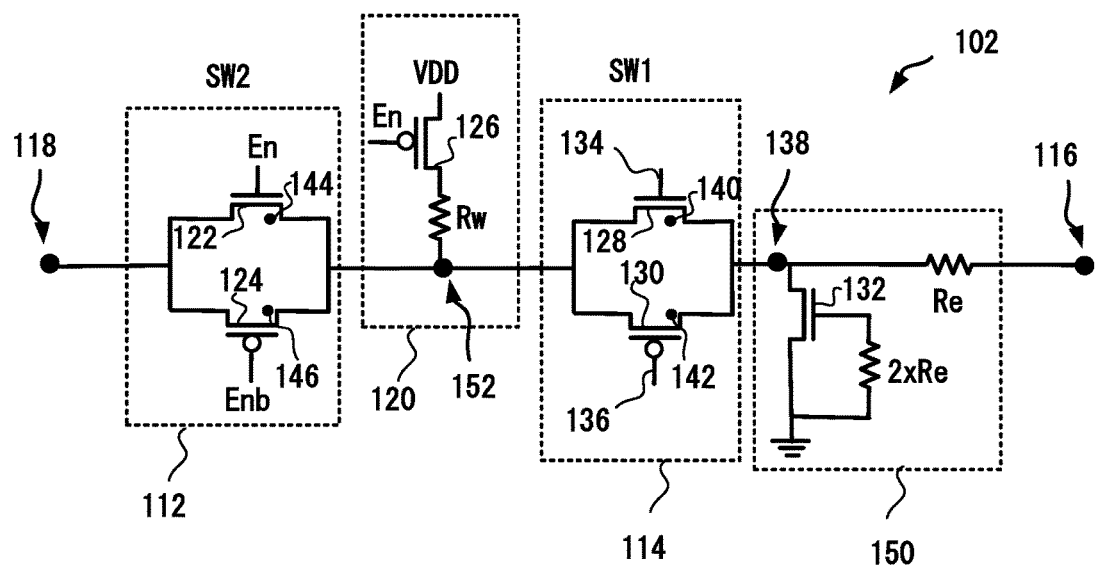
FIG. 2 depicts the switching block of the over-voltage tolerant test bus in accordance with one or more embodiments of the present disclosure.
Figure 3:
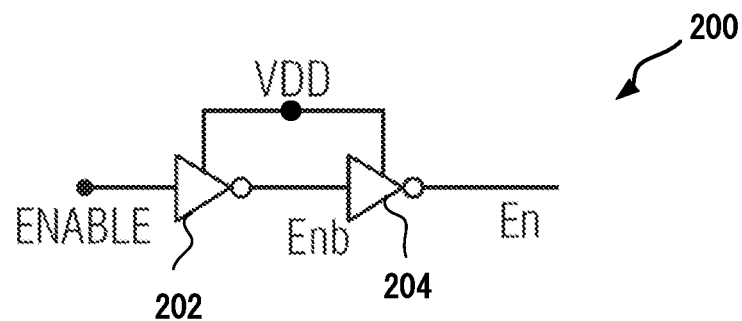
FIG. 3 shows a control signal generator based on a test enable signal in accordance with one or more embodiments of the present disclosure.

FIG. 2 shows the over-voltage tolerant test bus 102 in more details. The over-voltage tolerant test bus 102 includes SW2 112 that includes a first switch 122 and a second switch 124. The first switch 122 includes a gate that is driving by a signal $E_n$ and the second switch includes a gate that is driven by a signal $E_{nb}$. The first switch 122 and the second switch 124 may be CMOS transistors, NMOS and PMOS respectively. As shown in FIG. 3, the signals $E_n$ and $E_{nb}$ are generated by a circuit 200 based on a test enable signal (ENABLE). The circuit 200 may include a first inverter 202 and a second inverter 204 both powered by the device power supply $V_{DD}$. The output of the first inverter 202 produces the signal $E_{nb}$ and the output of the second inverter 204 produces the signal $E_n$.

Figure 4:
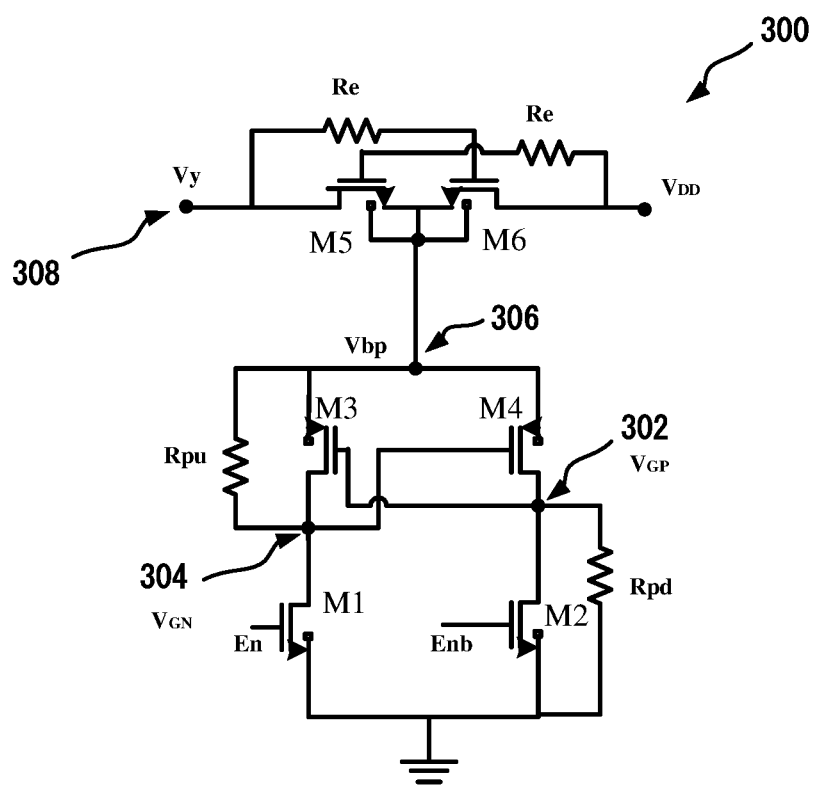
FIG. 4 shows a low leakage control circuit in accordance with one or more embodiments of the present disclosure.

The over-voltage tolerant test bus 102 further includes SW1 114 that includes a first switch 128 and a second switch 130. In some examples, the gate 134 of the first switch 128 may be driven by the signal $E_n$ and the gate 136 of the second switch 130 may be driven by the signal $E_{nb}$. However, in a preferred embodiment, the gate 134 and the gate 136 are be driven by signals produced by a low leakage control circuit. An embodiment of the low leakage control circuit is described in application Ser. No. 16/184,659 filed on Nov. 8, 2018 entitled "LOW LEAKAGE SWITCH CONTROL CIRCUIT" is being incorporated herein by reference. FIG. 4 described below shows a low leakage control 300 circuit in another embodiment.

The switch 128 includes a body region (e.g., the substrate surrounding the doped region that forms a transistor) 140. In some examples, the body region 140 may be grounded. Similarly the body region 142 of the switch 130 may be coupled to $V_{bp}$ (the node 306 in FIG. 4) to effectively reduce the formation of a parasitic diode when the switch SW1 114 is in off state, thus preventing a leak current through the over-voltage tolerant test bus 102 during the normal mode. The node 138 may be coupled to the $V_y$ voltage node 308 (FIG. 4).

The body region 144 of the switch 122 may be grounded and the body region 146 of the switch 124 may be coupled to $V_{DD}$ to reduce the leak current due to the formation of a parasitic diode between the source and the gate.

In some embodiments, the over-voltage tolerant test bus 102 includes an electrostatic discharge (ESD) circuit 150 that may include a switch 132 coupled to a resistor $R_e$ and ground. A second resistor is coupled between the gate of the switch 132 and ground. In some examples, the second resistor may have a value equal to twice of the value of $R_e$. The ESD circuit 150 may protect the switch SW1 114 from voltage spikes that may occur when a test probe interacts with the test pin 108.

A protection circuit 120 may be included to ensure that during a normal mode (that is when ENABLE is not active), the switch SW1 114 is protected from a high voltage at the test pin 108. The protection circuit 120 includes a switch 126 having a gate that is driven by the signal $E_n$. A weak pull up resistor $R_w$ is coupled between the switch 126 and the node 152. The value of the resistor $R_w$ is large enough (for example, >10 kΩ) to make a current flowing through $R_w$ is close to zero. During the test mode, the switch 126 is off, thus the voltage at the node 152 is set by the voltages at nodes 118 or 116 because the switch SW2 112 and the switch SW1 114 are on. However, during the normal mode, the switch 126 is on, thus voltage at the node 152 will be equal to $V_{DD}$. In one example, if VDD is 1.8V and the voltage at the test pin is 3.6V, during the normal mode, the voltage across Drain and Source of the switches 128, 130 is 3.6−1.8=1.8V which is within tolerable limits of the CMOS switches 128, 130. Without the protection circuit 120, the voltage at the node 152 would have been zero and if the voltage at the test pin was 3.6V, the voltage across Drain and Source of the switches 128, 130 would have been 3.6V. In many applications, CMOS devices may only handle up to 2.5V, thus having a 3.6V across the terminals of the switch SW1 114 could damage the switch SW1 114.

A pair of opposite type CMOS transistors (e.g., PMOS and NMOS) may be used used in parallel in the switch SW1

114 and the switch SW2 114 to minimize a leak dur to parasitic diodes that form between Drain and Source of the switches 122, 124, 128, 130.

FIG. 4 shows the low leakage control circuit 300 to produce gate drive signals for the switches 128, 130 to eliminate or minimize a current leak between the drain and the source of the switches 128, 130 due to the formation of a parasitic diode between the drain and the source. As mentioned earlier, in some embodiment, the signals $E_n$ and $E_{nb}$ may be used to drive the gates of the switches 128, 130. However, it is desirable that the switch SW1 114 does not leak during the normal mode (e.g., when the test mode is disabled). The low leakage control circuit 300 is described in details in application Ser. No. 16/184,659 filed on Nov. 8, 2018 entitled "LOW LEAKAGE SWITCH CONTROL CIRCUIT." FIG. 4 shows a modified version of a low leakage control circuit described in application Ser. No. 16/184,659. The low leakage control circuit 300 includes switches M1, M2, M3, M4 coupled in a bridge configuration. The gate is the switch M1 is driven by the signal $E_n$ and the gate of the switch M2 is driven by the signal $E_{nb}$. Weak pull up and pull-down resistors $R_{pu}$ and $R_{pd}$ are coupled across the drain and the source of the switch M1 and the drain and source of the switch M2 respectively to ensure that the switches M1 and M2 stays off during a startup of the device. Switches M5, M6 are coupled to the switches M3 and M4. The switches M5, M6 each have a first terminal and a second terminal and a gate. A resistor $R_e$ is coupled between the first terminal of the switch M5 and the gate of the switch M6. A resistor Re is coupled between the first terminal of the switch M6 and the gate of the switch M5. The first terminal of the switch M6 is coupled to $V_{DD}$. The port 308 may be coupled to the port 138 (FIG. 2). The low leakage control circuit 300 is configured to reverse bias a body diode or parasitic diode formed between the source and the drain of the PMOS transistor of the switch SW1 114 to ensure low leakage performance of the switch SW1 114 during the normal mode.

In normal mode when no current is flowing between the node 138 and the node 116 (or the test pin 108), $V_y$ (at the port 308 which is coupled to the port 138) is equal to the voltage at the test pin 108 ($V_{pin}$). The part of the circuit including the switches M5, M6 ensures that that if $V_y$ exceeds $V_{DD}$, the voltage at the node 306, $V_{bp}$=Max of $V_{DD}$ or $V_y$. $V_{bp}$ is used to reverse bias the switch 130. Therefore, if Vpin is 3.6V, the body 142 of the switch 130 is coupled to $V_{bp}$=3.6 v because Vbp is max of the supply voltage $V_{DD}$=1.8V and $V_y$ (which is equal to $V_{pin}$ in the normal mode)=3.6V. In this example, the voltage at the port 138 is 3.6V and the body 142 is coupled to $V_{bp}$=3.6V. Hence, there will be no leakage current through the body of the switch 130.

The values of $V_{GN}$ and $V_{GP}$ will be set based on the signals $E_n$, $E_{nb}$ and $V_{bp}$. The low leakage control circuit 300 includes a port 302 that produces a voltage $V_{GP}$ to drive the gate 136 of the switch 130. Similarly, a port 304 is included to produce a voltage $V_{GN}$ to drive the gate 134 of the switch 128. In the normal mode, the low leakage control circuit 300 ensures that the switch 128 is driven by $V_{bp}$ (e.g., the gate 134 is coupled to the port 304) which is the higher of $V_{DD}$ or $V_y$ (when the switch M1 is off, the voltage at the port 304 is equal to $V_{bp}$). During the test mode, the port 304 will be grounded because the switch M1 will be on, thus the gate 134 will also be grounded. During the normal mode, the voltage at the port 302 will be equal to $V_{bp}$, hence the gate 136, the body 142 and the port 138 will all have a voltage equal to $V_{bp}$.

Some or all of these embodiments may be combined, some may be omitted altogether, and additional process steps can be added while still achieving the products described herein. Thus, the subject matter described herein can be embodied in many different variations, and all such variations are contemplated to be within the scope of what is claimed.

While one or more implementations have been described by way of example and in terms of the specific embodiments, it is to be understood that one or more implementations are not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

Preferred embodiments are described herein known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

What is claimed is:

1. An over-voltage tolerant test bus for an integrated circuit (IC), comprising:
   a first switch to be coupled to a test pin of the IC;
   a second switch to be coupled to an internal module of the IC, wherein the second switch is coupled to the first switch in series; and
   a protection circuit coupled between the first switch and the second switch and a supply voltage to keep a voltage between a source and a drain of the first switch substantially equal to a difference between a voltage at the test pin and the supply voltage,
wherein when a test mode enable signal at the test pin is not active, the protection circuit is configured to provide a voltage equivalent to the supply voltage at the coupling of the first switch and the second switch.

2. The over-voltage tolerant test bus of claim 1, wherein the protection circuit includes a switch having a first terminal, a second terminal and a gate, the first terminal is coupled to the supply voltage, the second terminal is coupled to a resistor and the gate is driven by a test mode enable signal.

3. The over-voltage tolerant test bus of claim 2, wherein the switch is configured to be ON when the test mode enable signal is inactive.

4. The over-voltage tolerant test bus of claim 1, wherein the first switch and the second switch are configured to be ON when a test mode enable signal is active thus providing a conducting path between the test pin and the internal module.

5. The over-voltage tolerant test bus of claim 1, further including an electrostatic discharge circuit coupled between the first switch and the test pin.

6. The over-voltage tolerant test bus of claim 1, wherein the first switch includes a PMOS transistor and an NMOS transistor coupled together in parallel.

7. The over-voltage tolerant test bus of claim 6, wherein a gate of the NMOS transistor and a gate of the PMOS transistor are coupled to a low leakage control circuit.

8. The over-voltage tolerant test bus of claim 7, wherein the low leakage control circuit is configured to reverse bias a body diode of the PMOS transistor.

9. The over-voltage tolerant test bus of claim 8, wherein when a test mode enable signal is not active, the body diode of the POMOS transistor is reverse biased using a higher of a supply voltage of the IC and a voltage at the test pin.

10. The over-voltage tolerant test bus of claim 7, wherein the low leakage control circuit is configured to provide a higher of a supply voltage of the IC and a voltage at the test pin as a reverse biasing voltage and a gate control voltage for the first switch during a normal mode of operation of the IC.

11. The over-voltage tolerant test bus of claim 1, wherein the second switch includes a PMOS and an NMOS transistors coupled together in parallel.

12. The over-voltage tolerant test bus of claim 10, wherein a gate of the NMOS transistor is configured to be driven by a test mode enable signal and a gate of the PMOS transistor is configured to be driven by an inverse of the test mode enable signal.

13. The over-voltage tolerant test bus of claim 1, wherein the first switch is driven by a low leakage control circuit, wherein the low leakage control circuit includes,
a switch having an input node, gate, bulk region, and pin node;
a comparison circuit configured to determine and output a greater of two voltages of the switch;
a latching circuit connected to the comparison circuit and configured to bias the gate and the bulk region of the switch using the greater of the two voltages; and
a shorting circuit configured to control a voltage at the bulk region to ensure that no leakage current flows from the pin node.

14. An over-voltage tolerant test bus for an integrated circuit (IC), comprising:
a first switch to be coupled to a test pin of the IC;
a second switch to be coupled to an internal module of the IC, wherein the second switch is coupled to the first switch in series; and
a protection circuit coupled between the first switch and the second switch and a supply voltage to keep a voltage between a source and a drain of the first switch substantially equal to a difference between a voltage at the test pin and the supply voltage,
wherein the first switch includes a PMOS transistor and an NMOS transistor coupled together in parallel.

15. An over-voltage tolerant test bus for an integrated circuit (IC), comprising:
a first switch to be coupled to a test pin of the IC;
a second switch to be coupled to an internal module of the IC, wherein the second switch is coupled to the first switch in series; and
a protection circuit coupled between the first switch and the second switch and a supply voltage to keep a voltage between a source and a drain of the first switch substantially equal to a difference between a voltage at the test pin and the supply voltage,
wherein the first switch is driven by a low leakage control circuit, wherein the low leakage control circuit includes,
a switch having an input node, gate, bulk region, and pin node;
a comparison circuit configured to determine and output a greater of two voltages of the switch;
a latching circuit connected to the comparison circuit and configured to bias the gate and the bulk region of the switch using the greater of the two voltages; and
a shorting circuit configured to control a voltage at the bulk region to ensure that no leakage current flows from the pin node.

* * * * *